(12) United States Patent
Tanaka

(10) Patent No.: US 7,335,952 B2
(45) Date of Patent: Feb. 26, 2008

(54) SEMICONDUCTOR DEVICE AND MANUFACTURING METHOD THEREFOR

(75) Inventor: Hiroyuki Tanaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/224,013

(22) Filed: Sep. 13, 2005

(65) Prior Publication Data

US 2006/0014353 A1  Jan. 19, 2006

Related U.S. Application Data

(62) Division of application No. 10/853,645, filed on May 26, 2004, now Pat. No. 7,064,041.

(30) Foreign Application Priority Data

Dec. 24, 2003 (JP) ............................. 2003-426361

(51) Int. Cl.
*H01L 27/06* (2006.01)
(52) U.S. Cl. ..................... 257/350; 257/134; 257/256; 257/262; 257/272; 257/351; 257/504; 257/E27.112; 257/E29.265; 257/E29.266
(58) Field of Classification Search ................ 257/350
See application file for complete search history.

(56) References Cited

U.S. PATENT DOCUMENTS

| 4,908,328 | A | 3/1990 | Hu et al. |
| 6,127,701 | A | 10/2000 | Disney |
| 6,979,621 | B2 * | 12/2005 | Hshieh et al. .............. 438/270 |
| 2002/0195610 | A1 * | 12/2002 | Klosowiak ................... 257/98 |

FOREIGN PATENT DOCUMENTS

| JP | 01-183145 | 7/1989 |
| JP | 02-105565 | 4/1990 |
| JP | 06-334030 | 12/1994 |

* cited by examiner

*Primary Examiner*—Sue A. Purvis
*Assistant Examiner*—Eduardo A. Rodela
(74) *Attorney, Agent, or Firm*—Rabin & Berdo, P.C.

(57) ABSTRACT

To provide a semiconductor device that permits free setting of characteristics of individual semiconductor elements which are mixedly mounted and have different characteristics, and is free of steps between formed semiconductor elements, in a manufacturing method for the semiconductor device, an n-type silicon layer is deposited on a p-type silicon substrate by epitaxial growth, and then an SOI layer is deposited thereon through the intermediary of a BOX layer. A junction transistor using a part of the n-type silicon layer as a channel region and a MOS transistor using the SOI layer are produced.

20 Claims, 13 Drawing Sheets

SEMICONDUCTOR DEVICE AND MANUFACTURING METHOD THEREFOR

CROSS-REFERENCE TO RELATED APPLICATION

This is a division of application Ser. No. 10/853,645, filed May 26, 2004 now U.S. Pat. No. 7,064,041 by the same applicant, the entire contents of which are entirely incorporated herein by reference.

BACKGROUND OF THE INVENTION

1. Field of the Invention

The present invention relates to a semiconductor device and a manufacturing method therefor and, more particularly, to a semiconductor device having semiconductor elements with different characteristics mixedly incorporating and a manufacturing method therefor.

2. Description of the Related Art

Hitherto, as this type of semiconductor devices, there has been one, for example, in which an SOI layer is partly removed, and then a bulk device is deposited on an exposed Si substrate (refer to, for example, Patent Document 1, Japanese Unexamined Patent Application Publication No. H1-183145). There has been another one in which the surface of each semiconductor layer of a plurality of semiconductor layers provided through the intermediary of insulating films is exposed, and then an impurity is implanted through the exposed surface and diffused to form each semiconductor element (refer to, for example, Patent Document 2, Japanese Unexamined Patent Application Publication No. H2-105565). There has been yet another one in which an SIO layer is partly removed and a vertical power element serving as a bulk device is formed on an epitaxially grown Si on an exposed Si substrate (refer to, for example, Patent Document 3, Japanese Unexamined Patent Application Publication No. H6-334030).

However, according to the semiconductor devices disclosed in Patent Documents 1 and 2, large steps are produced between portions wherein semiconductor elements having different characteristics are formed, making it difficult to achieve microminiaturization from the aspects of uniformity of resists, control of contact depths, processability of wires, etc. The semiconductor device disclosed in Patent Document 3 includes a process involving partial thick-film epitaxial growth. Such partial epitaxial growth is difficult to control and not suited for microminiaturization, making the semiconductor device unsuited for mass production. Furthermore, an attempt to eliminate a step between semiconductor elements makes it impossible to uniquely determine the thickness of a film to be epitaxially grown. This makes it difficult to control the characteristics of a bulk device.

SUMMARY OF THE INVENTION

Accordingly, it is an object of the present invention to provide a semiconductor device that permits free setting of characteristics of individual semiconductor elements which are mixedly mounted and have different characteristics, and is free of steps between deposited semiconductor elements, and a manufacturing method for the same.

To this end, one aspect of the present invention provides a semiconductor device having a first semiconductor layer formed of a semiconductor of the first conductive type, a second semiconductor layer that is deposited on the first semiconductor layer and formed of a semiconductor of the second conductive type, which is the opposite conductive type from the semiconductor of the first conductive type, an insulating layer deposited on the second semiconductor layer, and a third semiconductor layer that is deposited on the insulating layer and formed of a semiconductor of the first conductive type or the second conductive type.

Another aspect of the present invention provides a manufacturing method for a semiconductor device having a junction transistor using a part of the second semiconductor layer as its channel region and a second semiconductor element formed using a first conductive type or a second conductive type semiconductor of the third semiconductor layer, the manufacturing method having a step for forming the second semiconductor layer on the first semiconductor layer by epitaxial growth, a step for forming the insulating layer and the third semiconductor layer, a step for partly removing the third semiconductor layer and the insulating layer to form a pair of first grooves, a step for forming one of a source region and a drain region in the second semiconductor layer at the bottom of one of the first grooves by ion implantation and heat treatment thereafter and for forming the other one of the source region and the drain region in the second semiconductor layer at the bottom of the other of the first grooves, a step for forming materials of the first conductive type in the pair of the first grooves, a step for forming a second groove by partly removing the third semiconductor layer and the insulating layer between pair of the first grooves, a step for forming a gate region in the second semiconductor layer at the bottom of the second groove by ion implantation and heat treatment thereafter, a step for forming a material of the second conductive type in the second groove, and a step for forming a separating layer by partly removing the second semiconductor layer, the insulating layer, and the third semiconductor layer to electrically isolate the region wherein the junction transistor is formed from the remaining region of the semiconductor device.

Still another aspect of the present invention provides a manufacturing method for a semiconductor device having a MOS transistor using a part of the first semiconductor layer as a drain region and a part of the second semiconductor layer as a channel region, and a second semiconductor element formed using a semiconductor of the first conductive type or the second conductive type of the third semiconductor layer, the manufacturing method having a step for depositing the second semiconductor layer on the first semiconductor layer by epitaxial growth, a step for forming an insulating layer and the third semiconductor layer, a step for forming a third groove by partly removing the third semiconductor layer and the insulating layer, a step for forming a source region in the second semiconductor layer at the bottom of the third groove by ion implantation and heat treatment thereafter, a step for forming a third conductive material in the third groove, a step for forming a fourth groove by partly removing at least the third conductive material, the source region, and the second semiconductor layer, a step for depositing a gate insulating film on side walls and a bottom surface of the fourth groove, a step for forming a fourth conductive material, which provides a gate electrode, in the fourth groove, and a step for forming at least a part of the third semiconductor layer into an insulating layer to electrically isolate the region wherein the MOS transistor is formed from the remaining region of the semiconductor device.

The present invention makes it possible to fabricate a semiconductor device that permits free setting of characteristics of individual semiconductor elements which have different characteristics and are mixedly mounted, and is free of a step between deposited semiconductor elements. It is possible therefore to provide a semiconductor device that features a high degree of freedom in designing the semiconductor device and is suited for achieving microminiaturization without sacrificing uniformity of resist, easy control of depths of contacts, and processability of wires, and to provide a manufacturing method for the same.

DESCRIPTION OF THE PREFERRED EMBODIMENTS

First Embodiment

Figure 1:
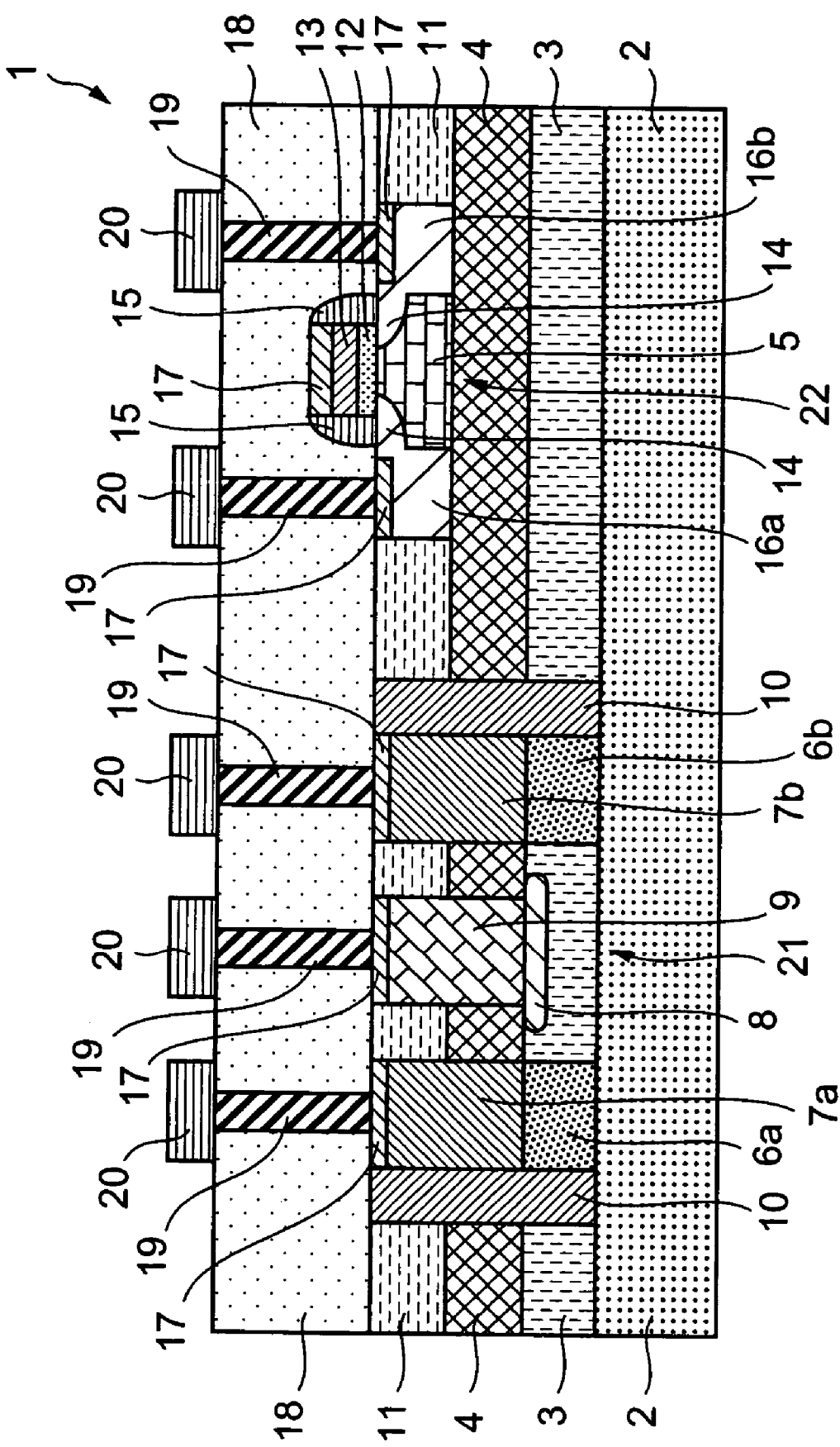
FIG. 1 is a sectional view schematically showing a configuration of an essential section of a semiconductor device according to a first embodiment of the present invention.

FIG. 1 is a sectional view schematically showing a configuration of an essential section of a semiconductor device 1 of a first embodiment according to the present invention.

As shown in FIG. 1, the semiconductor device 1 includes a junction transistor 21 serving as a first semiconductor element deposited on an n$^-$ silicon layer 3, which is a second semiconductor layer epitaxially grown on a p-type silicon substrate 2, which is a first semiconductor layer, and a MOS transistor 22 serving as a second semiconductor element deposited on a silicon-on-insulator (SOI) layer 5, which is a third semiconductor layer existing through the intermediary of a buried oxide (BOX) layer 4 serving as an insulating layer on the n$^-$ silicon layer 3.

Deposited in the region wherein the junction transistor 21 is formed are a source (drain) layer 6a and a drain (source) layer 6b of the junction transistor 21 that are made of n$^+$ silicon, buried layers 7a, 7b made of n$^+$ polysilicon, a gate layer 8 of the junction transistor 21 that is made of p$^+$ silicon, a buried layer 9 made of p$^+$ polysilicon, and a separating layer 10 made of a CVD oxide film.

Deposited in the region wherein the MOS transistor 22 is formed are a gate oxide film 12 made of a MOS oxide film, a gate electrode 13 of a MOS oxide film using n$^+$ polysilicon, a lightly doped drain (LDD) layer 14 made of n$^-$ silicon, a side wall oxide film 15, and a source (drain) layer 16a and a drain (source) layer 16b of the MOS transistor that use n$^+$ silicon. Furthermore, a field oxide film 11, a salicide layer 17 made of cobalt silicide, an intermediate insulating film 18 made of a CVD oxide film, contacts 19 made of tungsten, and metal wires 20 made of aluminum are formed in both regions.

A manufacturing method for the semiconductor device 1 will now be explained.

FIG. 2 to FIG. 8 illustrate the configuration of an essential section in each step of a fabricating process of the semiconductor device 1, and are used for explaining the manufacturing method.

Figure 2:
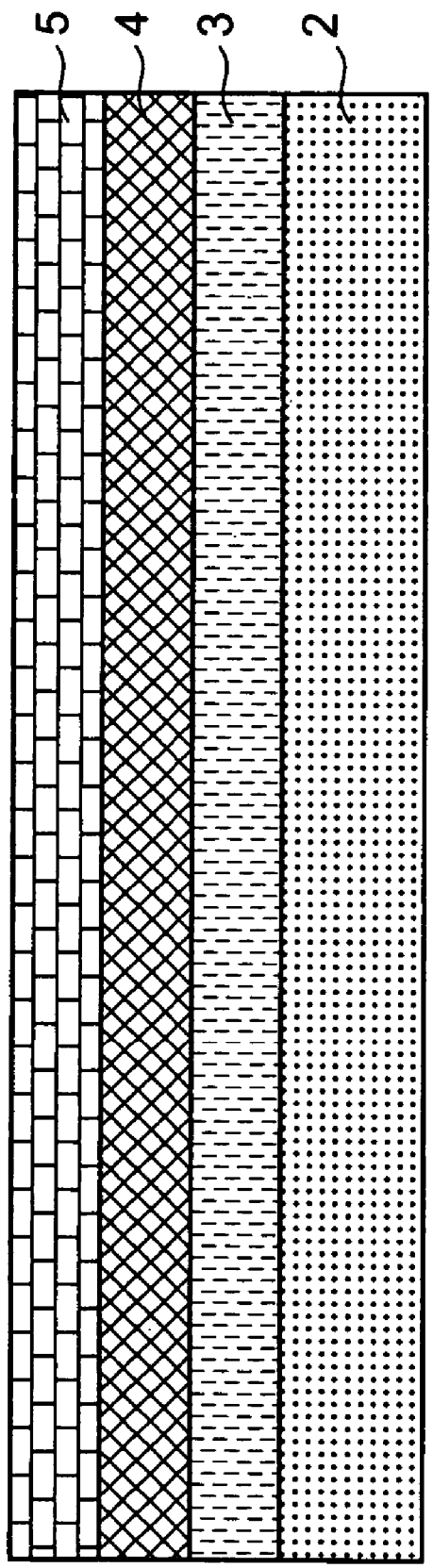
FIG. 2 is a diagram showing a configuration of an essential section of a manufacturing process of the semiconductor device, the diagram being used for explaining a manufacturing method for the same.

Referring first to FIG. 2, the n$^-$ silicon layer 3 is epitaxially grown on a p-type silicon substrate 2 by the low-pressure chemical vapor deposition (CVD) method using, as a material, a gas containing dichlorosilane (SiH$_2$Cl$_2$) and phosphine (PH$_3$). Thereafter, the SOI layer 5 made of p-type silicon is deposited on the n$^-$ silicon layer 3 through the intermediary of the BOX layer 4 by laminating.

Figure 3:
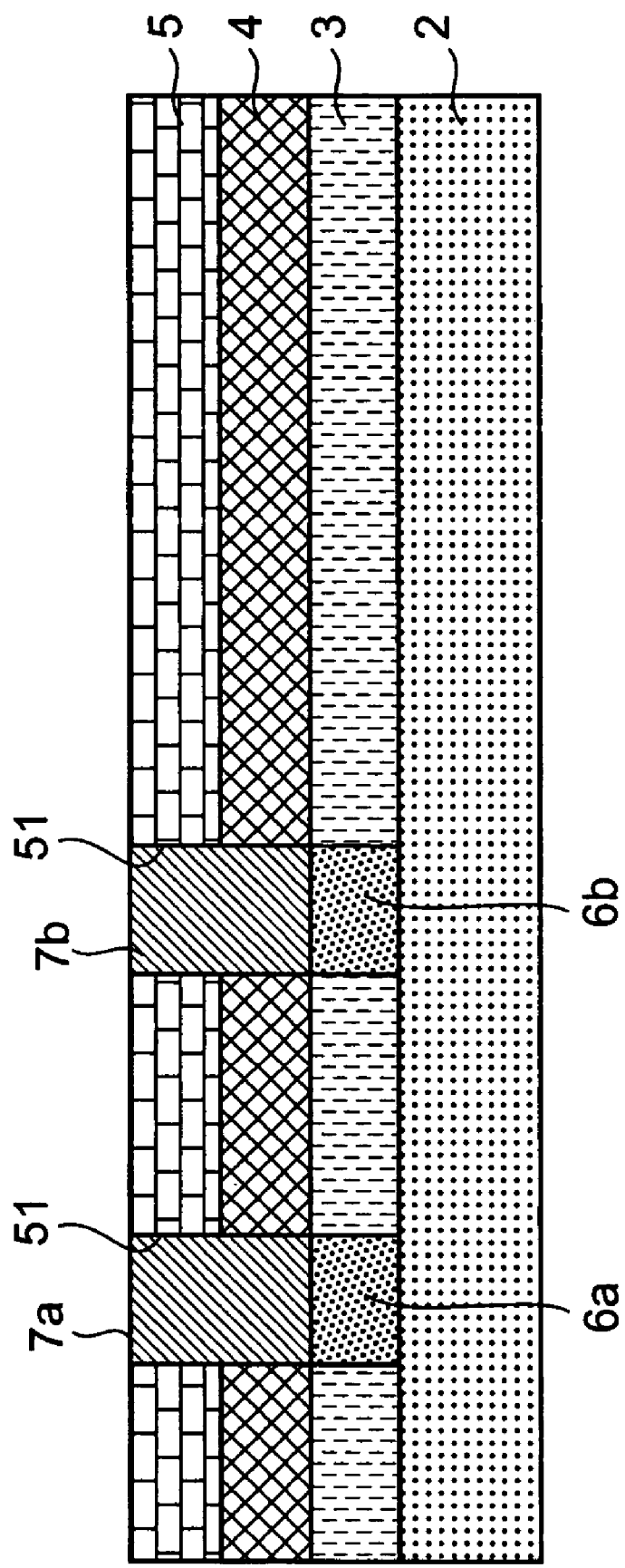
FIG. 3 is a diagram showing the configuration of the essential section of the manufacturing process of the semiconductor device, the diagram being used for explaining the manufacturing method for the same.

Then, in the state shown in FIG. 2, the BOX layer 4 and the SOI layer 5 above the region of the source (drain) layer 6a and the drain (source) layer 6b of the junction transistor 21 (FIG. 1) are removed by photolitho etching to form first grooves 51 shown in FIG. 3. Furthermore, the source (drain) layer 6a and the drain (source) layer 6b are formed in the n$^-$ silicon layer 3 that corresponds to the bottoms of the first grooves 51 by As$^+$ ion implantation and activated annealing thereafter. Subsequently, polysilicon containing an n$^+$ impurity is deposited over the entire surface by the CVD method, and burying layers 7a and 7b, which are first conductive materials, are formed to fill the first grooves 51 (FIG. 3) by etchback method.

Figure 4:
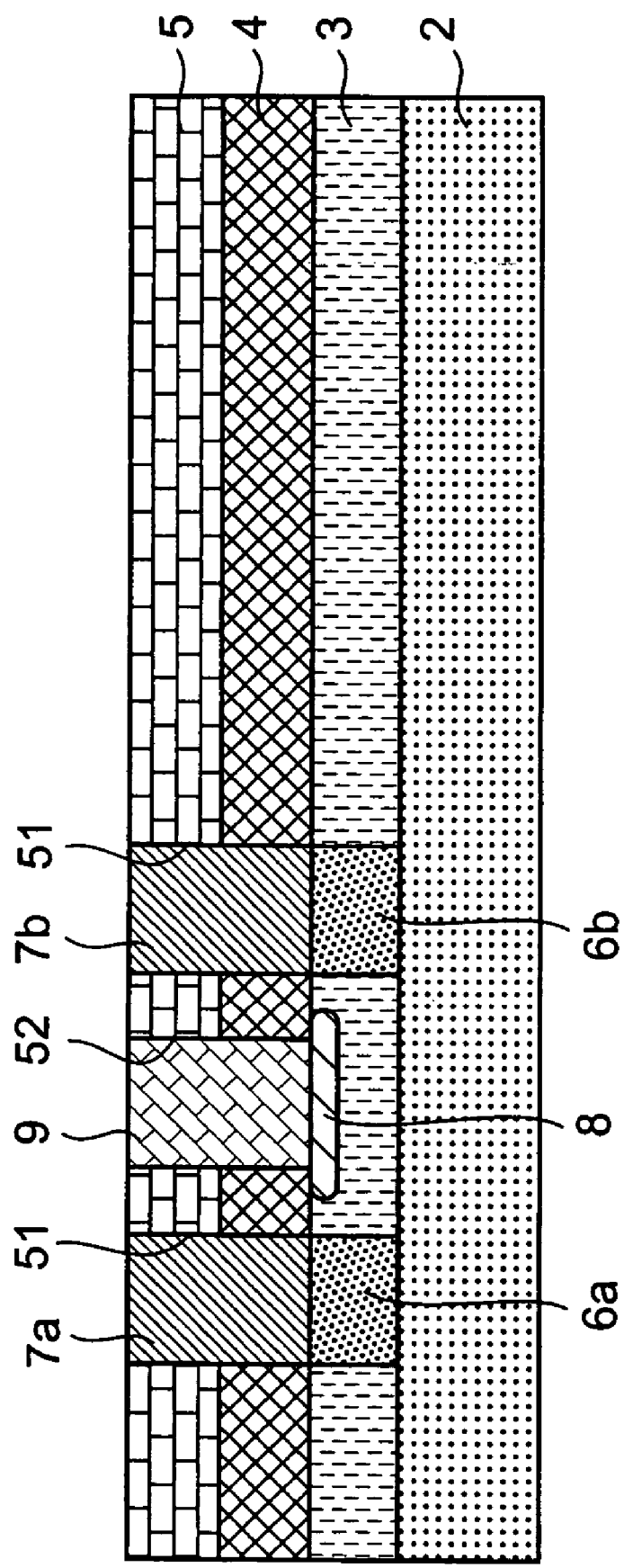
FIG. 4 is a diagram showing the configuration of the essential section of the manufacturing process of the semiconductor device, the diagram being used for explaining the manufacturing method for the same.

Next, in the state shown in FIG. 3, the BOX layer 4 and the SOI layer 5 above the region of the gate layer 8 of the junction transistor 21 (FIG. 1) are removed by photolitho etching to form second grooves 52 shown in FIG. 4. Furthermore, the gate layer 8 is formed by $BF_2^+$ ion implantation and activated annealing thereafter. Subsequently, polysilicon containing a $p^+$ impurity is deposited over the entire surface by the CVD method, and a burying layer 9, which is a second conductive material, is formed to fill the second groove 52 (FIG. 4) by the etchback method.

Thereafter, in the state shown in FIG. 4, the $n^-$ silicon layer 3, the BOX layer 4, and the SOI layer 5 are removed in a groove shape around the junction transistor 21 (FIG. 1), and an oxide film is deposited on the entire surface by the CVD method. Then, the separating layer 10 shown in FIG. 5 is formed to electrically isolate the junction transistor 21 from its surrounding semiconductor layer by the etchback method.

Figure 5:
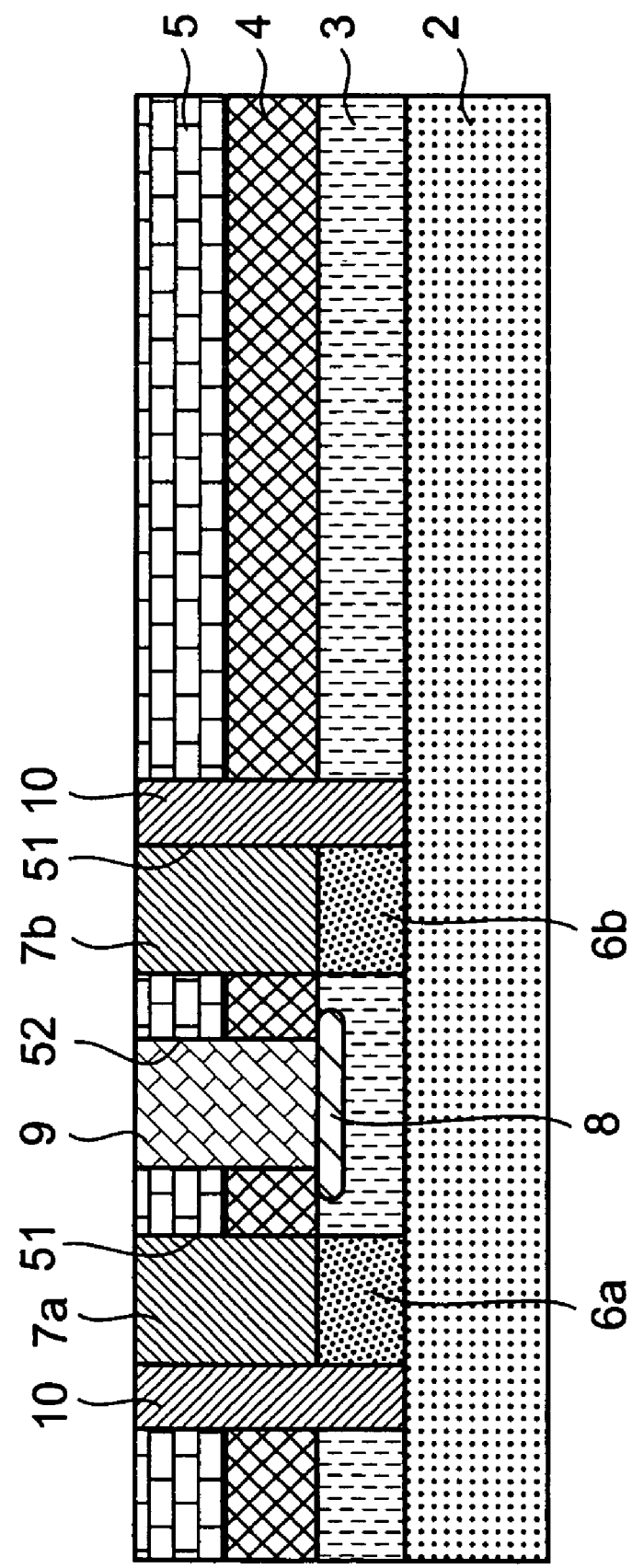
FIG. 5 is a diagram showing the configuration of the essential section of the manufacturing process of the semiconductor device, the diagram being used for explaining the manufacturing method for the same.
Figure 6:
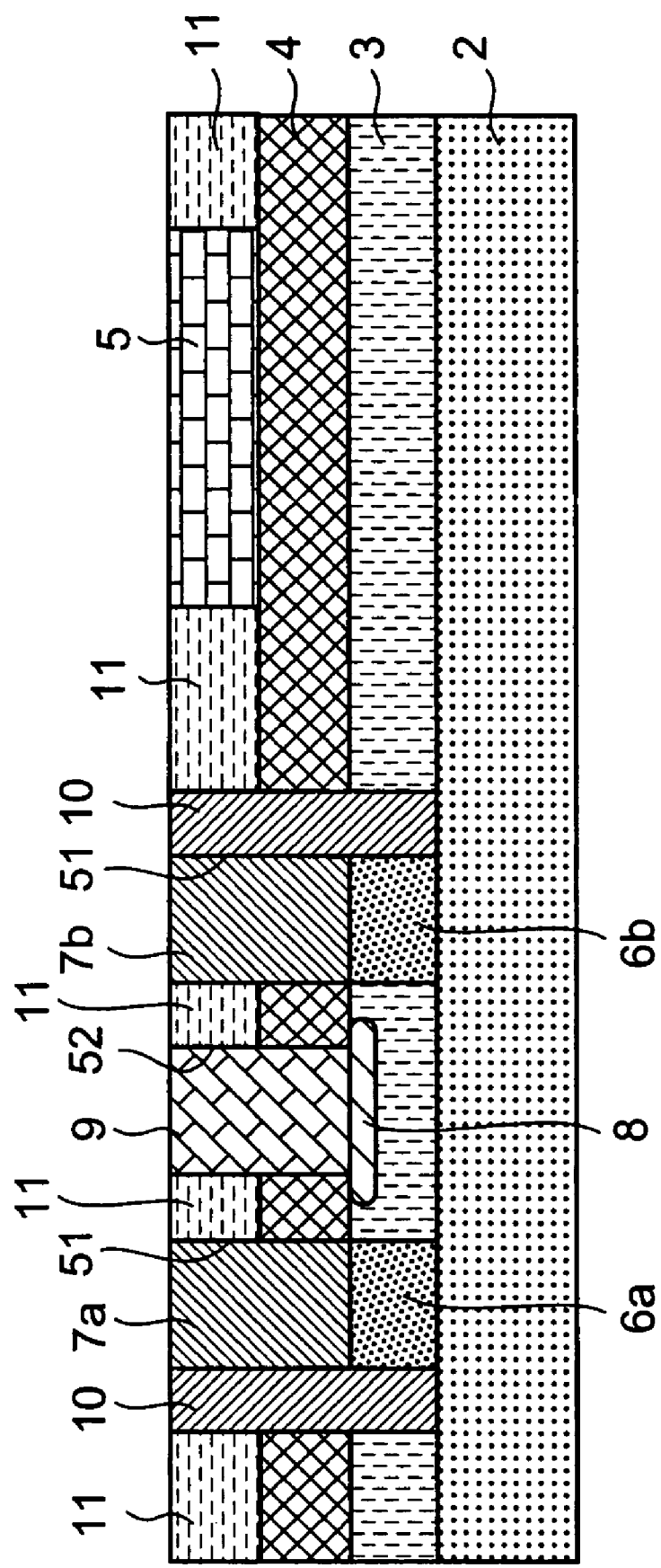
FIG. 6 is a diagram showing the configuration of the essential section of the manufacturing process of the semiconductor device, the diagram being used for explaining the manufacturing method for the same.

Next, in the state shown in FIG. 5, the field oxide film 11 is deposited in the region of the SOI layer 5 excluding a portion wherein the MOS transistor 22 (FIG. 1) is formed by the local oxidation of silicon (LOCOS) method, as shown in FIG. 6. Then, in the state shown in FIG. 6, thermal oxidation is carried out over the entire surface to form an oxide film layer. Furthermore, polysilicon containing an $n^+$ impurity is deposited over the entire surface, and then an unwanted portion is removed by photolitho etching so as to form the gate oxide film 12 and the gate electrode 13 of the MOS transistor 22 shown in FIG. 7.

Figure 7:
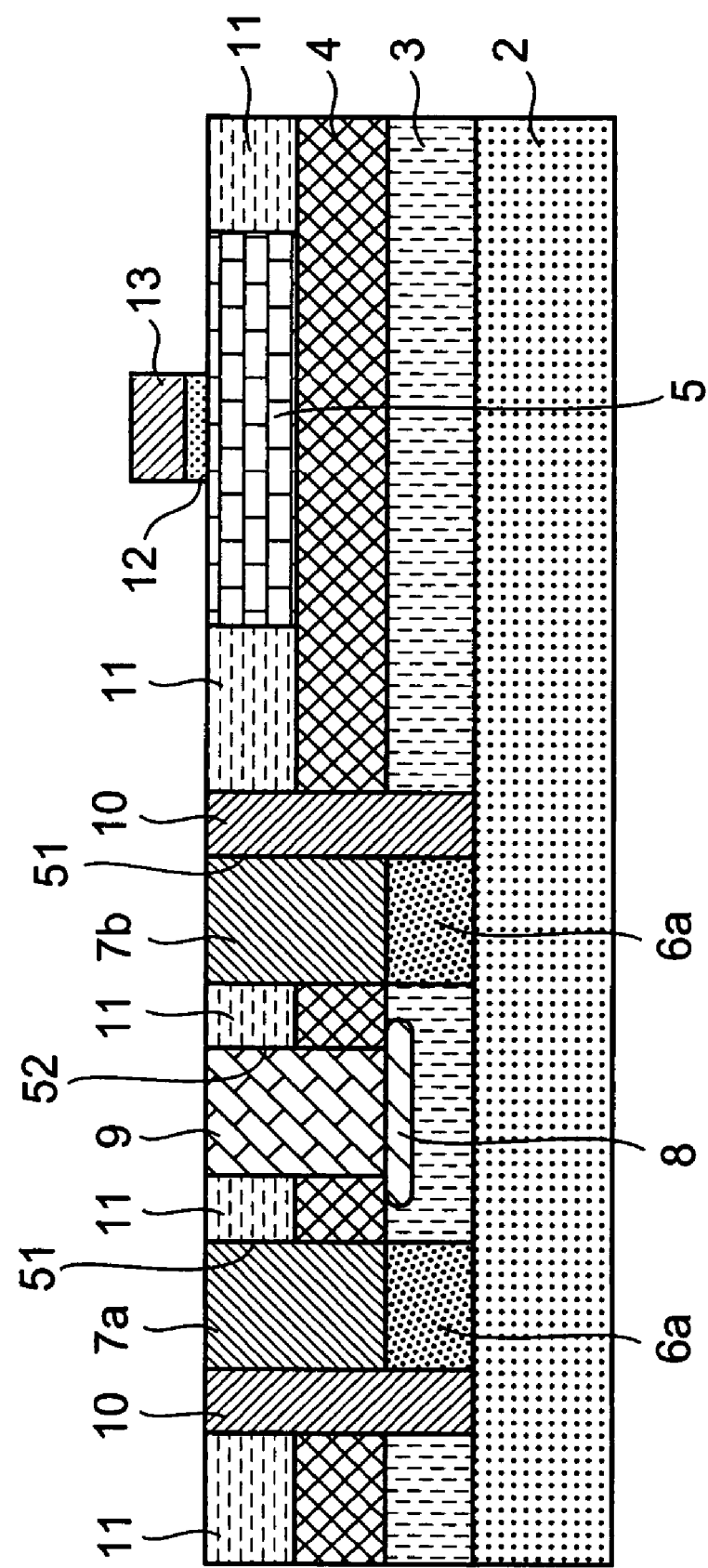
FIG. 7 is a diagram showing the configuration of the essential section of the manufacturing process of the semiconductor device, the diagram being used for explaining the manufacturing method for the same.
Figure 8:
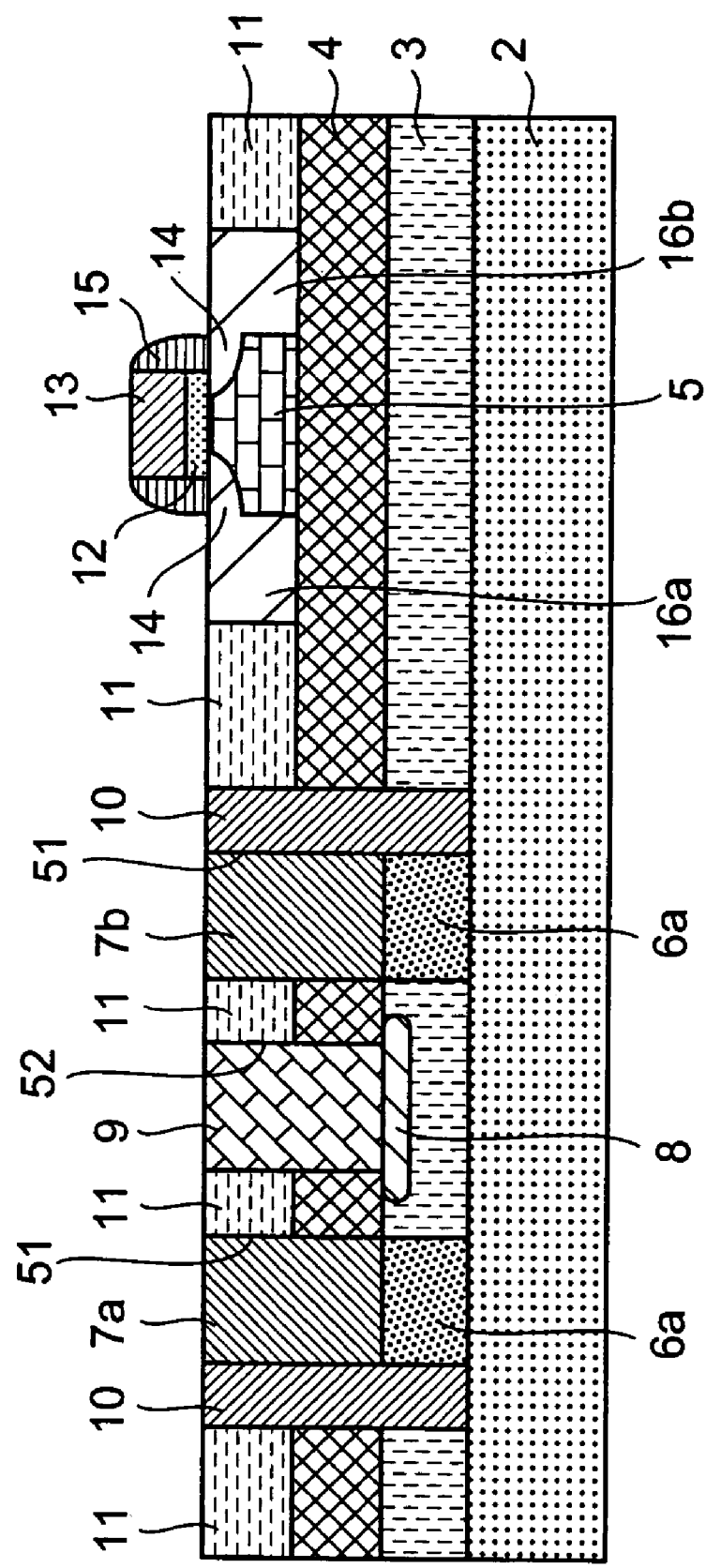
FIG. 8 is a diagram showing the configuration of the essential section of the manufacturing process of the semiconductor device, the diagram being used for explaining the manufacturing method for the same.

Subsequently, in the state shown in FIG. 7, the lightly doped drain (LDD) layer 14 (FIG. 8) made of $n^-$ silicon is formed in a predetermined region near the gate oxide film 12 by carrying out $As^+$ ion implantation and activated annealing thereafter on the SOI layer 5. An oxide film is deposited over the entire surface by the CVD method, and then etching is carried out to generate side walls 15 on both sides of the gate oxide film 12 and the gate electrode 13, as illustrated in FIG. 8. Furthermore, the source (drain) layer 16a and the drain (source) layer 16b of the MOS transistor shown in FIG. 8 are formed by carrying out $As^+$ ion implantation and activated annealing thereafter on the SOI layer 5.

Next, in the state shown in FIG. 8, cobalt is deposited on the entire surface, and then heat treatment is performed. Unreacted cobalt is removed to form the salicide layers 17 shown in FIG. 1 on the top surfaces of the buried layers 7a, 7b, and 9, the source (drain) layer 16a and the drain (source) layer 16b of the MOS transistor, and the gate electrode 13, respectively.

Next, the intermediate insulating film 18 (FIG. 1) is formed by the CVD method over the entire surface, and contact holes are formed by photolitho etching at predetermined positions on the intermediate insulating film 18 that are connected to the respective salicide layers 17. Furthermore, contacts 19 made of tungsten shown in FIG. 1 are formed in the contact holes by the sputtering method and the etchback method. Subsequently, aluminum is deposited over the entire surface by the sputtering method, and metal wires 20 (FIG. 1) electrically connected to the contacts 19 on the intermediate insulating film 18 are formed by photolitho etching. In FIG. 1, the contact 19 is not deposited on the salicide layers 17 on the gate electrode 13. This is because it is assumed that a contact to the salicide layer 17 deposited on the gate electrode 13 is formed at a different predetermined position from the position in the section shown in FIG. 1.

An operation of the semiconductor device 1 fabricated as described above will now be explained with reference to the sectional view of FIG. 1.

In the junction transistor 21 formed in the semiconductor device 1, a potential difference is provided between the source (drain) layer 6a and the drain (source) layer 6b, and the voltage applied to the gate layer 8 is changed to increase or decrease the width of a channel depletion layer formed under the gate layer 8 thereby to control current supplied to the source-drain. In the MOS transistor 22 formed in the semiconductor device 1, a predetermined voltage is applied to the gate electrode 13 to reverse the SOI layer 5 under the gate oxide film 12 thereby to form a channel. This makes it possible to control the current flowing between the source (drain) layer 16a and the drain (source) layer 16b to which the potential difference is being applied.

Thus, the semiconductor device 1 according to the present embodiment allows the junction transistor 21 to obtain desired characteristics by setting the thickness of the $n^-$ silicon layer 3 formed by epitaxial growth to a proper value, and the MOS transistor 22 to obtain desired characteristics by setting the thickness of the SOI layer 5 to a proper value. Thus, transistors having different, desired characteristics can be mixedly mounted on a single chip, allowing, for example, a complete depletion type MOS transistor and a large-current junction transistor to be mixedly mounted on a single chip. Moreover, the thickness of the intermediate insulating film 18 remains the same in both regions of the junction transistor 21 and the MOS transistor 22, making the semiconductor device ideally suited for microminiaturization from the aspects of resist uniformity, control of contact depths, processability of wiring, etc.

The manufacturing method for semiconductor devices according to the present embodiment allows the junction transistor 21 and the MOS transistor 22 having the desired characteristics to be formed in the same chip. The manufacturing method also makes it possible to prevent a step from being produced between the junction transistor 21 and the MOS transistor 22.

Second Embodiment

Figure 9:
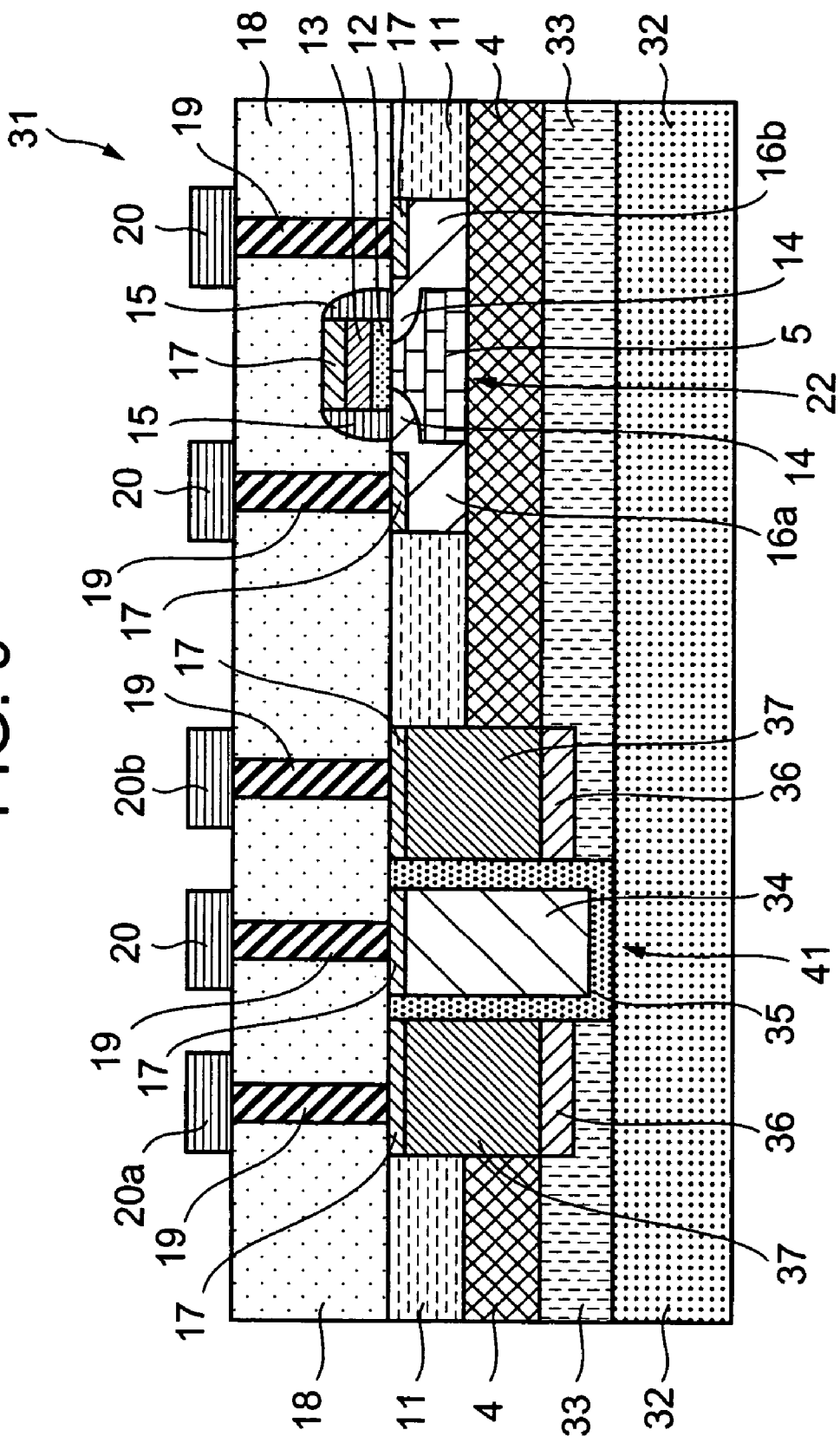
FIG. 9 is a sectional view schematically showing a configuration of an essential section of a semiconductor device according to a second embodiment of the present invention.

FIG. 9 is a sectional view schematically showing the configuration of an essential section of a semiconductor device 31 of a second embodiment according to the present invention. In the semiconductor device 31, the same component elements as those of the semiconductor device 1 of the first embodiment shown in FIG. 1 will be assigned the same reference numerals.

As shown in the figure, the semiconductor device 31 includes a MOS high voltage transistor 41 serving as a first semiconductor element deposited on a $p^-$ silicon layer 33, which is a second semiconductor layer epitaxially grown on an n-type silicon substrate 32, which is a first semiconductor layer, and a MOS transistor 22 serving as a second semiconductor element deposited on an SOI layer 5, which is a third semiconductor layer existing through the intermediary of a BOX layer 4 serving as an insulating layer on the $p^-$ silicon layer 33.

Formed in the region wherein the MOS high voltage transistor 41 is formed are a source layer 36 of the MOS high voltage transistor 41 that is formed of n+silicon, a buried layer 37 formed of $n^+$ polysilicon, a gate oxide film 35 of the MOS high voltage transistor 41, and a gate electrode 34 of a MOS oxide film made of $n^+$ polysilicon. In the MOS high voltage transistor 41, the n-type silicon substrate 32 works as a drain, so that it is assumed that a drain electrode (not shown) is electrically connected to the n-type silicon substrate 32.

Deposited in the region wherein the MOS transistor 22 is formed are a gate oxide film 12 made of a MOS oxide film, a gate electrode 13 of a MOS oxide film using $n^+$ polysilicon, an LDD layer 14 made of $n^-$ silicon, a side wall oxide film 15, and a source (drain) layer 16a and a drain (source) layer 16b of the MOS transistor that use n⁺ silicon. Furthermore, a field oxide film 11, a salicide layer 17 made of cobalt silicide, an intermediate insulating film 18 made of a CVD oxide film, contacts 19 made of tungsten, and metal wires 20 made of aluminum are formed in both regions.

A manufacturing method for the semiconductor device 31 shown in FIG. 9 will now be explained.

FIG. 10 to FIG. 13 illustrate the configuration of an essential section in each step of a fabricating process of the semiconductor device 31, and are used to explain the manufacturing method.

Figure 10:
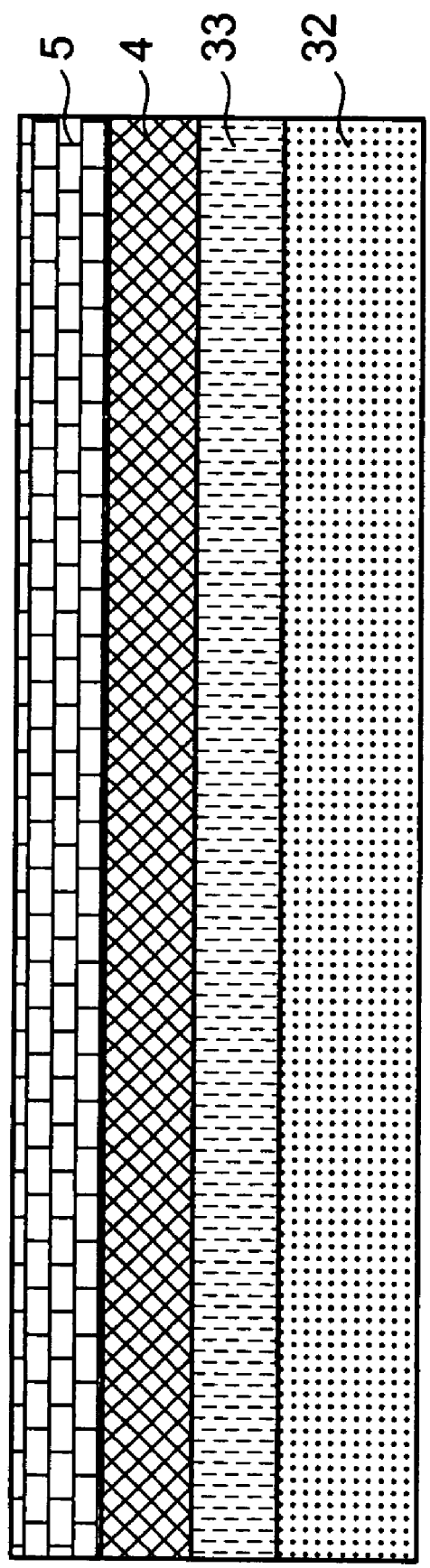
FIG. 10 is a diagram showing a configuration of an essential section of a manufacturing process of the semiconductor device, the diagram being used for explaining a manufacturing method for the same.

Referring first to FIG. 10, the p⁻ silicon layer 33 is epitaxially grown on the n-type silicon substrate 32 by the low-pressure CVD method using, as a material, a gas containing dichlorosilane ($SiH_2Cl_2$) and phosphine ($PH_3$). Thereafter, the SOI layer 5 made of p-type silicon is deposited on the p⁻ silicon layer 33 through the intermediary of the BOX layer 4 by laminating.

Figure 11:
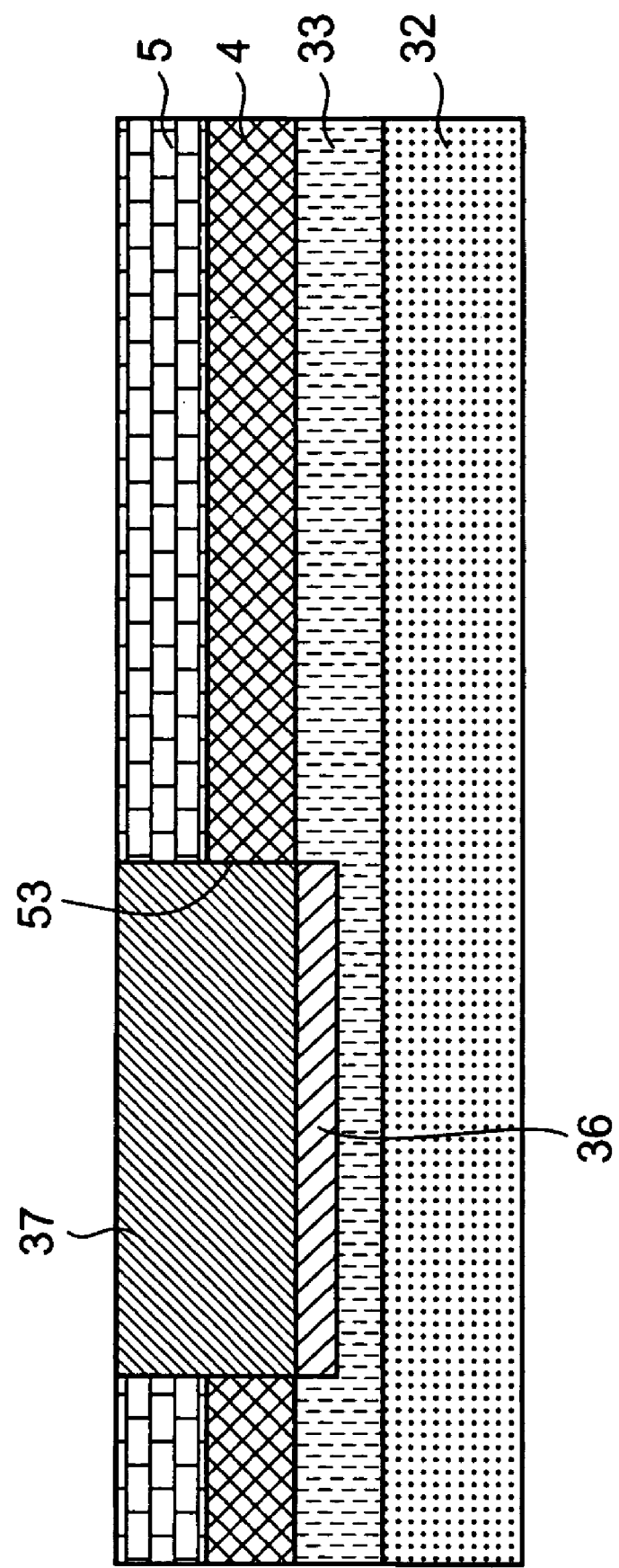
FIG. 11 is a diagram showing the configuration of the essential section of the manufacturing process of the semiconductor device, the diagram being used for explaining the manufacturing method for the same.

Then, in the state shown in FIG. 10, the BOX layer 4 and the SOI layer 5 above the region of the source layer 36 of the MOS high voltage transistor 41 (FIG. 9) are removed by photolitho etching to form a third groove 53 shown in FIG. 11. Furthermore, the source layer 36 that corresponds to the bottom of the third groove 53 is formed in the p⁻ silicon layer 33 by As⁺ ion implantation and activated annealing thereafter. Subsequently, polysilicon containing an n⁺ impurity is deposited over the entire surface by the CVD method, and a burying layer 37, which is a third conductive material, is formed to fill the third groove 53 (FIG. 11) by the etchback method.

Figure 12:
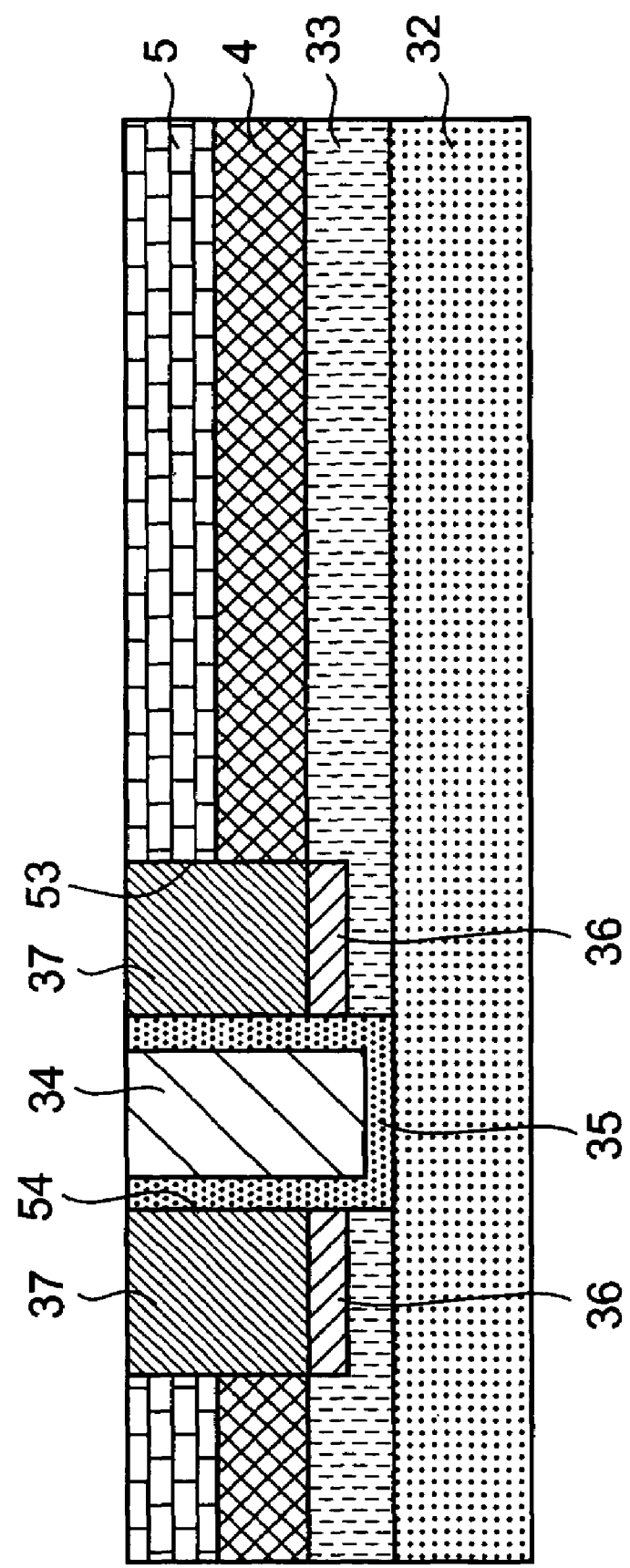
FIG. 12 is a diagram showing the configuration of the essential section of the manufacturing process of the semiconductor device, the diagram being used for explaining the manufacturing method for the same.

Next, in the state shown in FIG. 11, the p⁻ silicon layer 33, the source layer 36, and the burying layer 37 of the region wherein the gate electrode 34 and the gate oxide film 35 of the MOS high voltage transistor 41 (FIG. 9) are formed are removed by photolitho etching to form a fourth groove 54 shown in FIG. 12. The removal in this step by photolitho etching extends to the BOX layer 4 or the SOI layer 5 at different positions from those in the section shown in FIG. 12 in some cases. However, depositing a gate oxide film 35, which will be discussed hereinafter, obviates prevents inconveniences.

Furthermore, the gate oxide film 35 of the high voltage transistor 41 is formed in the fourth groove 54 by thermal oxidation, and then polysilicon containing an n⁺ impurity is deposited by the CVD method, and a gate electrode 34, which is a fourth conductive material, is formed to fill the fourth groove 54 (FIG. 12) by the etchback method.

Figure 13:
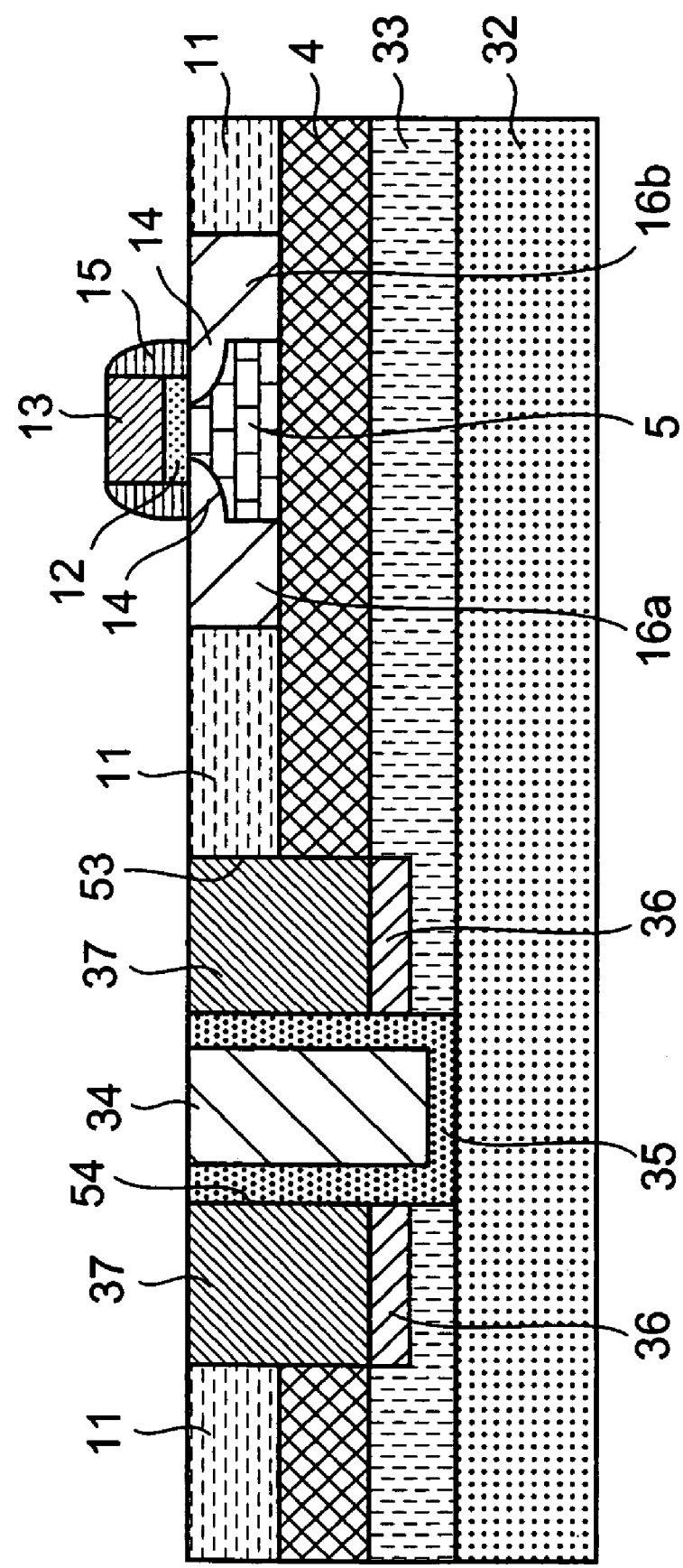
FIG. 13 is a diagram showing the configuration of the essential section of the manufacturing process of the semiconductor device, the diagram being used for explaining the manufacturing method for the same.

The process for forming the MOS transistor 22 (FIG. 9) in the SOI layer 5, as shown in FIG. 13, from the state shown in FIG. 12, and for forming the salicide layer 17, the intermediate insulating film 18, the contacts 19, and the metal wires 20 shown in FIG. 9 is carried out in the same manner as that for forming the same component elements from the state shown in FIG. 8 in the first embodiment described above. Hence, the explanation of the process will not be repeated. However, it is assumed that two metal wires 20a and 20b electrically connected to the source layer 36 in FIG. 9 are electrically interconnected at a different predetermined position from the position in the section shown in FIG. 9.

An operation of the semiconductor device 31 fabricated as described above will now be explained with reference to the sectional view of FIG. 9.

In the MOS high voltage transistor 41 formed in the semiconductor device 31, a predetermined voltage is applied to the gate electrode 34 to reverse the p⁻ epitaxial silicon layer 33 in contact with the gate oxide film 35 to form a channel. This makes it possible to control the current flowing between the source layer 36 and the drain, which is the n⁺ silicon substrate 32, to which the potential difference is being applied. In the MOS transistor 22, a predetermined voltage is applied to the gate electrode 13 to reverse the SOI layer 5 under the gate oxide film 12 so as to form a channel. This makes it possible to control the current flowing between the source (drain) layer 16a and the drain (source) layer 16b to which a potential difference is being applied.

Thus, the semiconductor device 31 according to the present embodiment allows the MOS high voltage transistor 41 having the back surface (the bottoms surface of the n-type silicon substrate 32 in FIG. 9) as a drain lead-out to be mounted together with the complete depletion type MOS transistor 22 on one chip in a SOI substrate having the SOI layer 5. Moreover, the semiconductor device allows the MOS high voltage transistor 41 to obtain desired characteristics by setting the thickness of the p⁻ silicon layer 33 formed by epitaxial growth to a proper value, and the MOS transistor 22 to obtain desired characteristics by setting the thickness of the SOI layer 5 to a proper value. Moreover, the thickness of the intermediate insulating film 18 remains the same in both regions of the high voltage MOS transistor 41 and the MOS transistor 22, making the semiconductor device ideally suited for microminiaturization from the aspects of resist uniformity, control of contact depths, processability of wires, etc.

The manufacturing method for semiconductor devices according to the present embodiment allows the MOS high voltage transistor 41 and the MOS transistor 22 having the desired characteristics to be formed in the same chip. The manufacturing method also makes it possible to prevent a step from being produced between the high voltage MOS transistor 41 and the MOS transistor 22.

In the aforesaid embodiments, the SOI layers have been formed using p-type silicon; however, the present invention is not limited thereto. The SOI layers may alternatively be formed using n-type silicon, or may take various modes.

In the explanation of the aforesaid scope of claims and the embodiments, the terms "above" and "under" have been used for convenience sake, and are not intended to limit an absolute positional relationship in a disposed semiconductor device.

What is claimed is:

1. A semiconductor device comprising:
    a first silicon substrate of a first conductive type including a first region and a second region;
    a second silicon substrate of a second conductive type different from the first conductive type, the second silicon substrate being formed on the first silicon substrate;
    a buried oxide layer formed on an upper surface of the second silicon substrate;
    a first transistor formed on the buried oxide layer directly above the second region of the first silicon substrate; and
    a second transistor formed in the second silicon substrate on the first region of the first silicon substrate.

2. The semiconductor device according to claim 1, wherein the second transistor is a junction transistor.

3. The semiconductor device according to claim 1, wherein:
    the junction transistor includes a part of the second silicon substrate as a channel region;
    the first silicon substrate is formed of p-type silicon; and
    the second silicon substrate is formed of n-type silicon.

4. The semiconductor device according to claim 1, wherein the first transistor is a MOS transistor including a drain region formed of an n-type silicon substrate and a channel region formed of a p-type silicon substrate.

5. The semiconductor device according to claim 4, wherein the first silicon substrate is formed of n-type silicon, and the second silicon substrate formed of p-type silicon.

6. The semiconductor device according to claim 1, further comprising a separating layer formed in a groove shape around the second transistor, the separating layer surrounding and electrically isolating the second transistor.

7. The semiconductor device according to claim 1, further comprising a third silicon substrate formed on the buried oxide layer directly above the second region of the first silicon substrate, wherein the first transistor is a MOS transistor including a source layer and a drain layer between which the third silicon substrate is disposed.

8. The semiconductor device according to claim 1, wherein the second transistor is a junction transistor including (i) a source layer, a drain layer and a gate layer formed respectively in the second silicon substrate, and (ii) buried polysilicon layers formed respectively on the source, drain and gate layers.

9. The semiconductor device according to claim 1, further comprising a third silicon substrate formed on the buried oxide layer directly above the second region of the first silicon substrate, wherein:
the first transistor is a MOS transistor including a source layer and a drain layer between which the third silicon substrate is disposed; and
the second transistor is a junction transistor including (i) a source layer, a drain layer and a gate layer formed respectively in the second silicon substrate, and (ii) buried polysilicon layers formed respectively on the source, drain and gate layers.

10. A semiconductor device comprising:
a first silicon substrate of a first conductive type including a first region and a second region;
a second silicon substrate of a second conductive type different from the first conductive type, the second silicon substrate being formed on the first silicon substrate;
a buried oxide layer formed on an upper surface of the second silicon substrate;
a junction transistor formed in the second silicon substrate on the first region of the first silicon substrate;
a MOS transistor formed on the buried oxide layer directly above the second region of the first silicon substrate; and
a separation layer formed between the junction transistor and the MOS transistor.

11. The semiconductor device according to claim 10, wherein the junction transistor includes (i) a source layer, a drain layer and a gate layer formed respectively in the second silicon substrate, and (ii) buried polysilicon layers formed respectively on the source, drain and gate layers.

12. The semiconductor device according to claim 11, wherein:
the junction transistor further includes a part of the second silicon substrate, which is disposed between the source layer and the drain layer of the junction transistor, as a channel region;
the first silicon substrate is formed of p-type silicon; and
the second silicon substrate is formed of n-type silicon.

13. The semiconductor device according to claim 11, wherein the junction transistor further includes salicide layers formed respectively on a top surface of each of the buried polysilicon layers.

14. The semiconductor device according to claim 11, wherein each of the buried polysilicon layers penetrates through the buried oxide layer.

15. The semiconductor device according to claim 10, further comprising a third silicon substrate formed on the buried oxide layer directly above the second region of the first silicon substrate, wherein the MOS transistor includes a source layer and a drain layer between which the third silicon substrate is disposed.

16. The semiconductor device according to claim 15, wherein:
the drain region of the MOS transistor is formed of an n-type silicon substrate; and
the third silicon substrate between the source layer and the drain layer of the MOS transistor is a channel region of the MOS transistor and is formed of a p-type silicon substrate.

17. The semiconductor device according to claim 15, wherein the third silicon substrate between the source layer and the drain layer of the MOS transistor is a channel region of the MOS transistor and is formed of an n-type silicon substrate.

18. The semiconductor device according to claim 15, wherein the MOS transistor further includes salicide layers formed respectively on the source layer and the drain layer.

19. The semiconductor device according to claim 10, further comprising a third silicon substrate formed on the buried oxide layer directly above the second region of the first silicon substrate, wherein:
the junction transistor includes (i) a source layer, a drain layer and a gate layer formed respectively in the second silicon substrate, and (ii) buried polysilicon layers formed respectively on the source, drain and gate layers; and
the MOS transistor includes a source layer and a drain layer between which the third silicon substrate is disposed.

20. The semiconductor device according to claim 10, wherein the separating layer is formed in a groove shape around the junction transistor, and surrounds and electrically isolates the junction transistor.

* * * * *